(12) United States Patent
Kreisler et al.

(10) Patent No.: US 9,472,704 B2
(45) Date of Patent: Oct. 18, 2016

(54) RADIATION DETECTOR AND MEDICAL DIAGNOSTIC SYSTEM

(71) Applicant: SIEMENS AKTIENGESELLSCHAFT, Munich (DE)

(72) Inventors: Björn Kreisler, Hausen (DE); Christian Schröter, Bamberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 104 days.

(21) Appl. No.: 14/166,886

(22) Filed: Jan. 29, 2014

(65) Prior Publication Data

US 2014/0231944 A1     Aug. 21, 2014

(30) Foreign Application Priority Data

Feb. 19, 2013   (DE) .................. 10 2013 202 630

(51) Int. Cl.
G01T 1/164 (2006.01)
H01L 31/08 (2006.01)
H01L 27/146 (2006.01)

(52) U.S. Cl.
CPC ....... H01L 31/085 (2013.01); H01L 27/14676 (2013.01)

(58) Field of Classification Search
CPC ............. G01T 1/241; H01L 27/14676; H01L 31/085; H01L 27/148; H01L 29/76816
USPC .................... 250/363.03; 257/429
See application file for complete search history.

(56) References Cited

U.S. PATENT DOCUMENTS 5,465,002 A * 11/1995 Snoeys ................. H01L 27/146
250/370.08
5,677,539 A * 10/1997 Apotovsky ............. G01T 1/241
250/370.01

(Continued)

FOREIGN PATENT DOCUMENTS

CN     101858983 A     10/2010
CN     101918860 A     12/2010

(Continued)

OTHER PUBLICATIONS

German Office Action for priority application DE 10 2013 202 630.7 dated Nov. 19, 2013.

(Continued)

*Primary Examiner* — David J Makiya
*Assistant Examiner* — Taeho Jo
(74) *Attorney, Agent, or Firm* — Harness, Dickey & Pierce

(57) ABSTRACT

A radiation detector is disclosed, including a plurality of detector elements arranged adjacent to one another in a planar manner. In an embodiment, for the purpose of radiation detection, a semiconductor layer with an upper side and a lower side is present, the semiconductor layer on one of the sides including an electrode embodied so as to extend across a number of detector elements and electrodes subdivided into individual electrodes being arranged on the other side of the semiconductor layer so that by applying voltage between the electrodes of the two sides, an electrical field is generatable and each individual electrode is assigned an effective volume so as to collect charge in the semiconductor layer. In an embodiment, the individual electrodes are alternately connected to at least two different voltage potentials. Furthermore, a medical diagnostic system is disclosed, including at least one such radiation detector.

17 Claims, 4 Drawing Sheets

(56) References Cited

U.S. PATENT DOCUMENTS

| | | | | |
|---|---|---|---|---|
| 6,011,265 A * | 1/2000 | Sauli | ........................ | H01J 47/02 250/374 |
| 6,034,373 A * | 3/2000 | Shahar | .............. | H01L 27/14676 250/338.4 |
| 6,037,595 A | 3/2000 | Lingren | | |
| 6,169,287 B1 * | 1/2001 | Warburton | ............ | G01T 1/2928 250/370.09 |
| 6,518,575 B1 * | 2/2003 | Imai | ...................... | G01T 1/2928 250/370.09 |
| 7,223,982 B1 * | 5/2007 | Chen | ...................... | G01T 1/2928 250/370.01 |
| 2004/0026624 A1 | 2/2004 | Wainer et al. | | |
| 2007/0007457 A1 * | 1/2007 | Blevis | ...................... | G01T 1/2018 250/370.09 |
| 2008/0267353 A1 * | 10/2008 | Rundle | .................. | G01N 21/49 378/87 |
| 2009/0179155 A1 * | 7/2009 | Weinberg | .................. | G01T 1/16 250/370.01 |
| 2010/0252744 A1 * | 10/2010 | Herrmann | ............... | G01T 1/241 250/370.14 |
| 2010/0282972 A1 | 11/2010 | Carmi et al. | | |
| 2011/0155918 A1 * | 6/2011 | Bouhnik | ................. | G01T 1/249 250/370.14 |
| 2011/0163305 A1 * | 7/2011 | Ogusu | ................. | H01L 27/1462 257/42 |
| 2011/0233418 A1 * | 9/2011 | Horsfall | .................. | G01T 1/241 250/370.14 |
| 2012/0313196 A1 * | 12/2012 | Li | ...................... | H01L 27/1446 257/429 |
| 2013/0026379 A1 * | 1/2013 | Lohse | ...................... | H04N 5/32 250/370.12 |
| 2013/0126999 A1 * | 5/2013 | Rusian | .................. | H01L 31/085 257/428 |
| 2013/0161523 A1 * | 6/2013 | Tkaczyk | ............... | H01L 31/085 250/370.13 |
| 2014/0183371 A1 * | 7/2014 | Roessl | ...................... | G01T 1/24 250/370.09 |
| 2014/0284489 A1 * | 9/2014 | Engel | ...................... | G01T 1/241 250/370.09 |

FOREIGN PATENT DOCUMENTS

| | | | | |
|---|---|---|---|---|
| EP | | 1788410 A1 | 5/2007 | |
| WO | WO 2010073189 A1 * | | 7/2010 | ....... H01L 27/14603 |

OTHER PUBLICATIONS

German priority application DE 10 2013 202 630.7, filed Feb. 19, 2013.

Chinese Office Action Issued in Chinese Patent Application No. 201410047367.9, Dated Dec. 3, 2015.

Cheng, Feng et al. "Discussion of Several Common Radiation Sensors for Medical-used X-ray Protection Monitoring Application" Chinese Journal of Radiological Health, vol. 19, issue 1, Mar. 2010.

German Office Action dated Aug. 8, 2016 in German Application No. 10 2013 202 630.7.

* cited by examiner

RADIATION DETECTOR AND MEDICAL DIAGNOSTIC SYSTEM

PRIORITY STATEMENT

The present application hereby claims priority under 35 U.S.C. §119 to German patent application number DE 102013202630.7 filed Feb. 19, 2013, the entire contents of which are hereby incorporated herein by reference.

FIELD

At least one embodiment of the invention generally relates to a radiation detector having a plurality of detector elements arranged adjacent to one another in a planar manner, wherein for the purpose of radiation detection a semiconductor layer with an upper side and a lower side is present. In at least one embodiment, the semiconductor layer on one of the sides has an electrode embodied so as to extend across a number of detector elements and electrodes subdivided into individual electrodes are arranged on the other side of the semi-conductor layer, so that by applying voltage between the electrodes of the two sides, an electrical field can be generated and each individual electrode is assigned an effective volume so as to collect charge in the semiconductor layer. Furthermore, at least one embodiment of the invention also generally relates to a CT system having such a radiation detector.

BACKGROUND

Radiation detectors for the measurement, pixel by pixel, of the dose of x-ray radiation are generally known and are used in medical diagnostics, in particular in CT, angiography, SPECT and PET. With more recent detector developments, directly converting materials are frequently used. Typical examples are for instance III-V or II-VI semiconductors, such as cadmium telluride or cadmium zinctelluride. In order to detect x-ray radiation, the semiconductors will be surrounded by electrodes and a high voltage is applied between said electrodes. On account of this electrical field which penetrates the semiconductors, x-ray-generated charge carriers are separated and can be measured at the electrodes as current. In order to achieve the local resolution of the detector, one of the electrodes is typically pixelated, i.e. subdivided into subsurfaces.

SUMMARY

The inventors have noticed that detectors designed in such a way do not necessarily operate in a linear manner and this causes image artifacts to be produced in the result.

At least one embodiment of the invention is directed to a layout of a radiation detector which leads to the unwanted image artifacts and to propose a radiation detector which largely eliminates the underlying problem or at least reduces its effect.

Advantageous developments of the invention form the subject matter of subordinate claims.

The inventors have identified that by interrupting the electrodes on the pixelated subdivided side of the semiconductor, areas inevitably appear which do not have metallization and are therefore also not connected with the external voltage. These areas require field-free volumes in the semiconductor. Charge carriers which reach these volumes are no longer dissipated and therefore form depletion zones. These depletion zones cause the field lines to move toward the pixelated electrode. A changed response function of the affected pixel takes place on account of this change in the effective pixel size, as a result of which unacceptable artifacts are produced in the imaging, in particular in conjunction with tomographic reconstruction methods.

Attempts can essentially be made to minimize the non-contacted surface between the pixels so as to keep the field-free volumes as low as possible. Since a minimal distance of the pixelated surfaces has to be retained on account of the necessary capacitive decoupling, the effect can herewith be minimized, but, however, not prevented. Furthermore, on account of the photolithographic manufacturing process, a minimal distance of a few micrometers must be maintained between the pixels. This unwanted effect can thus not be entirely eliminated by means of geometric variation.

The inventors have however identified that by applying different electrical potentials to the adjacent subsurfaces (pixels), the electrical field is brought into a configuration in which no field-free volumes arise. Minimal differences of a few volts between subsurfaces are sufficient here, while a high voltage prevails between the electrodes on the two sides of the semiconductor. It is only essential here for a potential difference to be present between the individual subsurfaces and for electrical fields lines to develop as a result herebetween and for no field line-free space to exist.

The largest potential difference thus remains between the one electrode covering the entire surface on one side of the semiconductor layer and the subsurfaces on the other side of the semiconductor layer. However, the adjacent subsurfaces are set to a marginally different potential level, so that field lines now develop in the boundary area between the subsurfaces, which cause free charges arising there to be transported away.

With subsurfaces of the same size, the different potentials of the individual pixels result in different effective pixel sizes. I.e. the electrically effective surface differs from the geometric since, due to the different potentials, the field lines close to the pixel no longer run in parallel as in the plate capacitor, but instead between the electrodes, even in parallel with the sensor surface. This can however be taken into account in corresponding calibration tables.

Alternatively, the metalized surface can also be enlarged or minimized in accordance with the applied potential, in order ultimately to achieve effective pixels of equal size. Depending on the embodiment, a compromise can be found between the suppression of the field-free volumes and technical outlay.

By preventing field-free volumes, free charge carriers are always dissipated to the electrodes. As a result, no depletions develop, which would require a change in the detector response. This contribution to the detector drift can thus be avoided. The more stable behavior of the detector allows artifacts in the imaging to be greatly reduced.

Accordingly, the inventors propose a radiation detector having a plurality of detector elements arranged adjacent to one another in a planar manner, wherein for the purpose of radiation detection, a semiconductor layer exists with an upper side and a lower side, the semiconductor layer on one of the sides has an electrode embodied so as to extend across a number of detector elements and electrodes subdivided into individual electrodes are arranged on the other side of the semi-conductor layer, so that by applying voltage between the electrodes of the two sides, an electrical field can be generated and each individual electrode is assigned an effective volume so as to collect charge in the semiconductor layer. The improvement consists in individual electrodes being alternately connected to at least two different voltage potentials.

Accordingly, a medical diagnostic system is also proposed, which is equipped with at least one inventive radiation detector. In particular, this relates to CT systems, C-arm systems, PET systems and SPECT systems.

BRIEF DESCRIPTION OF THE DRAWINGS

The invention is described in more detail below on the basis of preferred example embodiments with the aid of the figures, wherein only the features required to understand the invention are shown. The following reference signs are used: 1: CT system; 2: x-ray emitter; 3: detector; 4: x-ray emitter; 5: detector; 6: gantry housing; 7: patient; 8: patient couch; 9: system axis; 10: control and computing unit; D: radiation detector; E1: electrode; E2: electrode subsurface; F: field lines; H: semiconductor layer; Prg1-Prgn: computer programs; U1, U2; U2.1-U2.4: voltage potential; V: field linefree volumes.

in detail.

DETAILED DESCRIPTION OF THE EXAMPLE EMBODIMENTS

Figure 1:
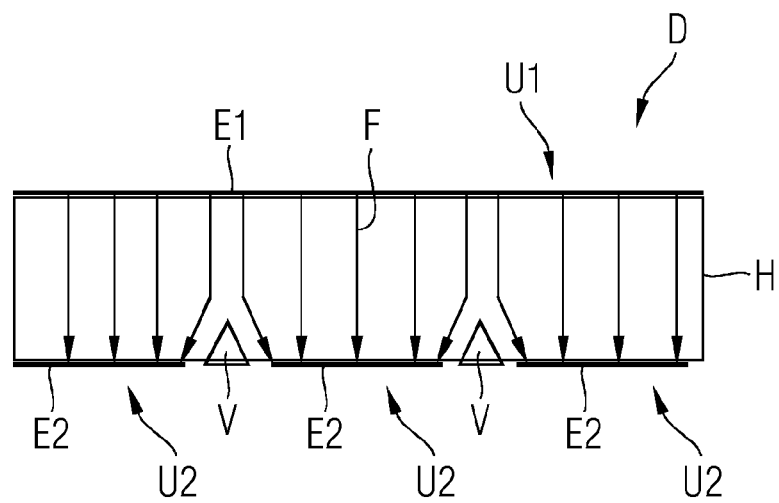
FIG. 1 shows a section through a known semiconductor radiation detector.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Accordingly, the inventors propose a radiation detector having a plurality of detector elements arranged adjacent to one another in a planar manner, wherein for the purpose of radiation detection, a semiconductor layer exists with an upper side and a lower side, the semiconductor layer on one of the sides has an electrode embodied so as to extend across a number of detector elements and electrodes subdivided into individual electrodes are arranged on the other side of the semiconductor layer, so that by applying voltage between the electrodes of the two sides, an electrical field can be generated and each individual electrode is assigned an effective volume so as to collect charge in the semiconductor layer. The improvement consists in individual electrodes being alternately connected to at least two different voltage potentials.

This means that no field-free volumes form and thus also no depletion zones are formed charge carriers stored there.

In a first simple variant, the individual electrodes can be connected in rows or columns with different voltage potentials. This eliminates a large proportion of field-free volumes which might otherwise be present.

An improvement can be achieved by three or four different voltage potentials being provided for the individual electrodes.

For further improvement, it is proposed that the individual electrodes are arranged in a checkerboard manner and are connected to the different voltage potentials such that adjacent electrode areas always have different voltage potentials in each instance. Field-free volumes in the intermediate area of the detector elements are herewith prevented.

The radiation detector can advantageously also be embodied from individual electrodes with a hexagonal surface, wherein these are arranged in the tightest possible package and are connected to the different voltage potentials such that adjacent electrode areas always have different voltage potentials in each instance.

In addition, in an embodiment, the inventors also propose configuring the surfaces of the individual electrodes with a different voltage potential with different sizes such that each detector element detects the same effective volume in the semiconductor layer irrespective of the applied voltage potential through its field lines.

Alternatively, means can be provided to compensate for different sizes of effective volumes of the detector elements, wherein a corresponding calibration herefor then ensures that the measured charge on the detector elements is evaluated to be higher with smaller effective volumes than the measured charge on the detector elements with larger effective volumes.

The inventive radiation detector of an embodiment can preferably be embodied as a counting detector. Furthermore, an inventive detector can be used in particular in a CT system.

Accordingly, a medical diagnostic system is also proposed, which is equipped with at least one inventive radiation detector. In particular, this relates to CT systems, C-arm systems, PET systems and SPECT systems.

Figure 2:
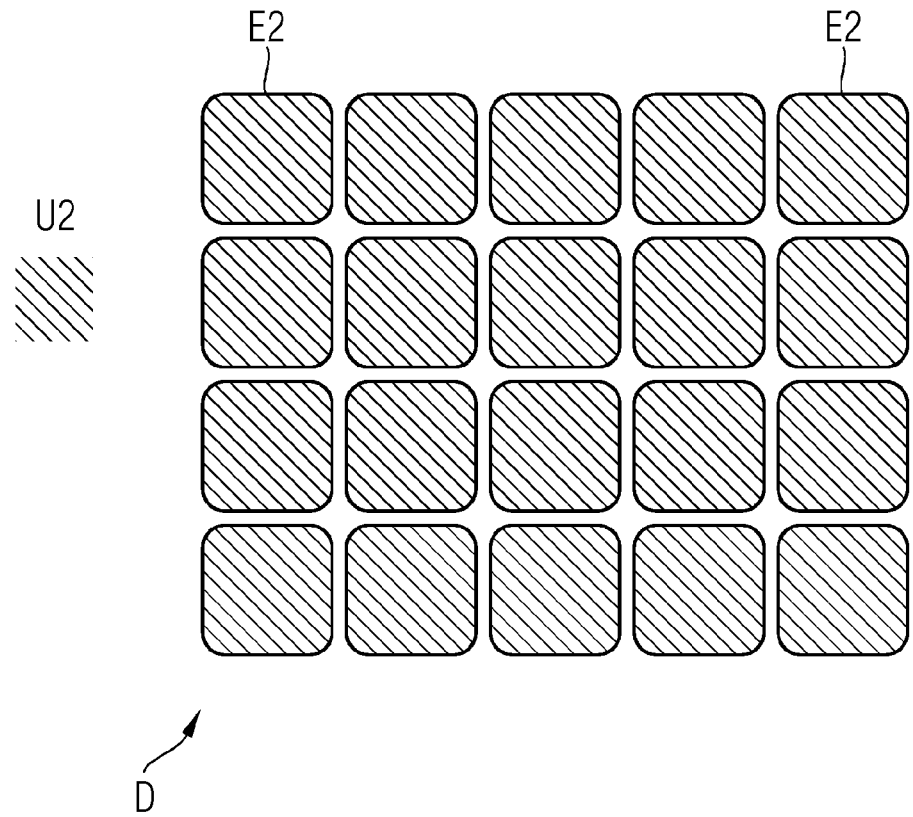
FIG. 2 shows a view onto the subsurfaces of a known semiconductor radiation detector.

FIGS. 1 and 2 each show a schematic representation of a part section of a semiconductor radiation detector D with the pixelated subdivision of the one electrode side in each instance. FIG. 1 shows a section through the semiconductor layer H with a first electrode E1 embodied over the entire surface, which lies at the voltage potential U1. On the other side of the semiconductor layer H, a number of individual electrodes are arranged, which are formed by electrode subsurfaces E2. All subsurfaces E2 lie at the same electrical potential U2 here. Accordingly, the field lines F shown as arrows appear within the semiconductor layer H. In the lower region of the semiconductor H, the field lines F are deflected in each instance toward the electron subsurfaces E2, so that the field line-free volumes V form. If free charges are generated in these volumes B on account of the incident radiation, these thus form depletion clouds, which are not dissipated on account of the electrical field not prevailing there.

FIG. 2 shows the detector D from FIG. 1 in a view onto the subsurfaces E2. The subsurfaces all lie at the same potential level U2, which is shown by the same drawing. No electrical field thus forms in the free areas between the electrode subsurface E2, so that field-free volumes develop there which result in the afore-described problems.

In accordance with an embodiment of the invention, the detector shown in FIGS. 1 and 2 can however be modified such that at least partially adjacent electrode subsurfaces are placed on different voltage potentials so that electrical field lines F develop between the electrode subsurfaces E2.

Figure 3:
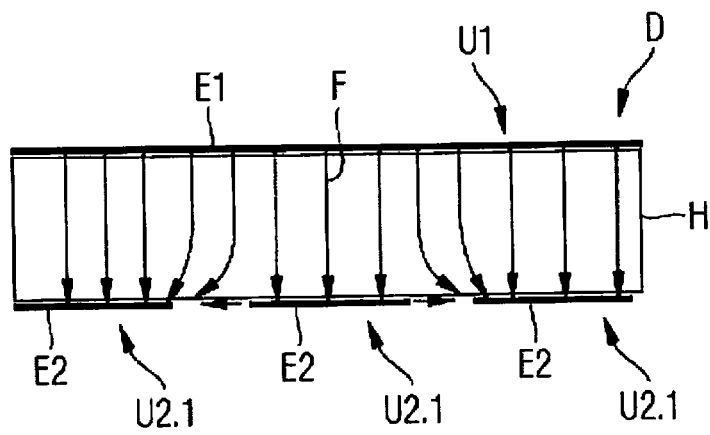
FIG. 3 shows a section through an embodiment of an inventively embodied semiconductor radiation detector.

FIG. 3 shows a section through a detector D with the semiconductor layer H and a first electrode E1 embodied over the entire surface, which lies at the voltage potential U1. A number of electrode subsurfaces E2 are in their turn arranged on the other side of the semiconductor layer H. With this inventive embodiment of the detector D, the electrode subsurfaces E2 nevertheless lie at different voltage potentials U2.1 and U2.2, wherein $U2.1<U2.2<<U1$ applies. Accordingly, the field lines F shown as arrows appear within the semiconductor layer H such that an electrical field develops also in the lower region not covered by the electrode subsurfaces E2. Field line-free volumes are thus prevented by the different potentials of the electrode subsurfaces.

Figure 4:
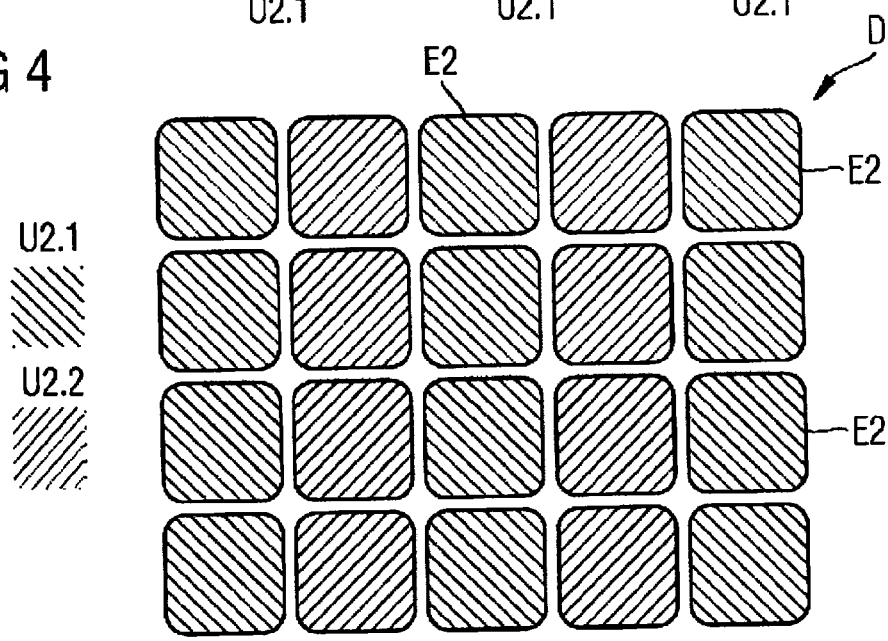
FIG. 4 shows a view onto the subsurfaces of a semiconductor radiation detector with two voltage potentials which alternate in columns.

In FIG. 4, the detector D from FIG. 3 is shown in a view onto the electrode subsurfaces E2 arranged in a chequerboard manner, wherein the electrode subsurfaces E2 are shaded in accordance with the applied voltage potential U2.1 or U2.2. As can be seen, different and identical potentials are realized here column by column (from left to right) and row by row (from top to bottom) in each instance. In this way field-free volumes are prevented between the adjacent electrode subsurfaces of a column in each instance. Nevertheless, field-free volumes still develop between the adjacent electrode subsurfaces E2 of a row so that, although the problem of depletion clouds possibly forming and not being dissipated improves compared with the prior art, said problem is however not entirely eliminated.

Figure 5:
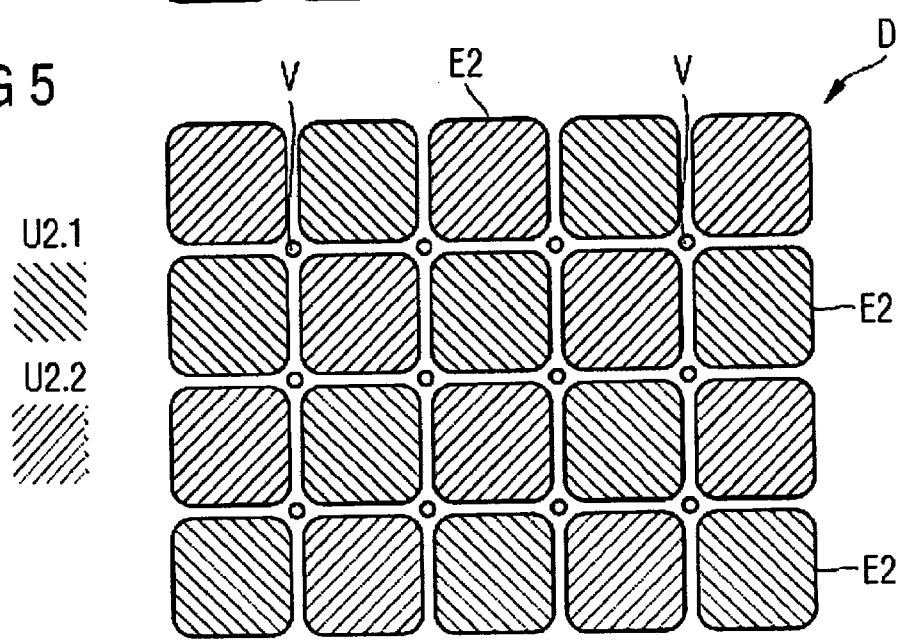
FIG. 5 shows a view onto the subsurfaces of a semiconductor radiation detector with two voltage potentials which alternate in a chequerboard manner.

An improved variant of a potential distribution in a detector D is shown in FIG. 5, in which a view onto the sub-divided electrode subsurfaces E2 is likewise shown. The difference from the embodiment in accordance with FIG. 4 consists in the distribution of the two different voltage potentials now corresponding in accordance with the distribution of the black and white fields of a chess board. The field-free volumes V herewith drastically reduce on the surfaces shown in the areas in which electrode subsurfaces approach the same potential.

Figure 6:
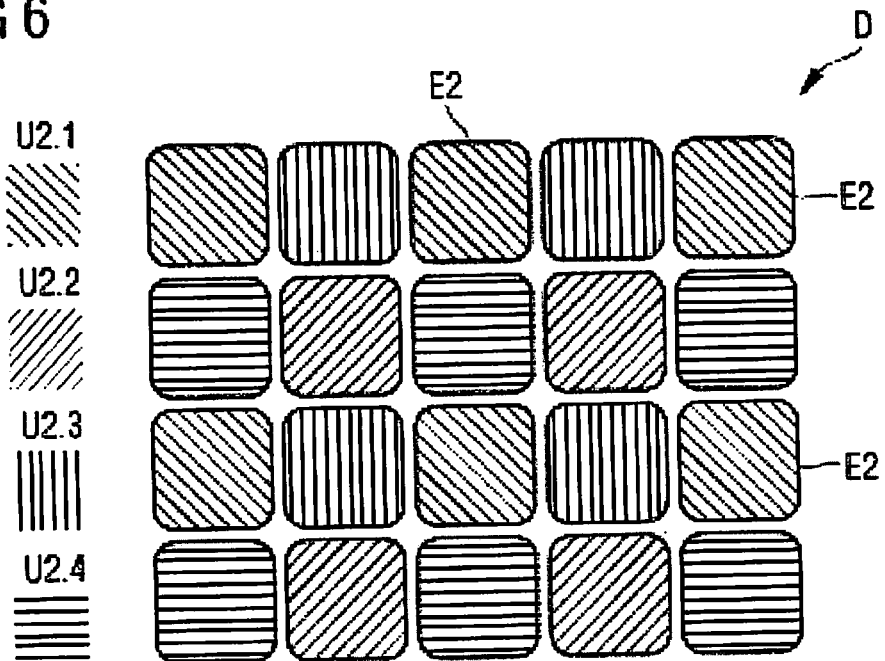
FIG. 6 shows a view onto the subsurfaces of a semiconductor radiation detector with four alternating voltage potentials.

A further improvement is achieved as a result, such that with a chequerboard design of the electrode subsurfaces, and thus of the detector elements formed therefrom, not two but four different voltage potentials are applied to the electrode subsurfaces. These voltage potentials $U2.1$ to $U2.4$ are shown in FIG. 6 by four different shadings. With the distribution of the different voltage potentials shown here, it is ensured that at no point are the electrode subsurfaces E2, which have the same voltage potential, adjacent.

Figure 7:
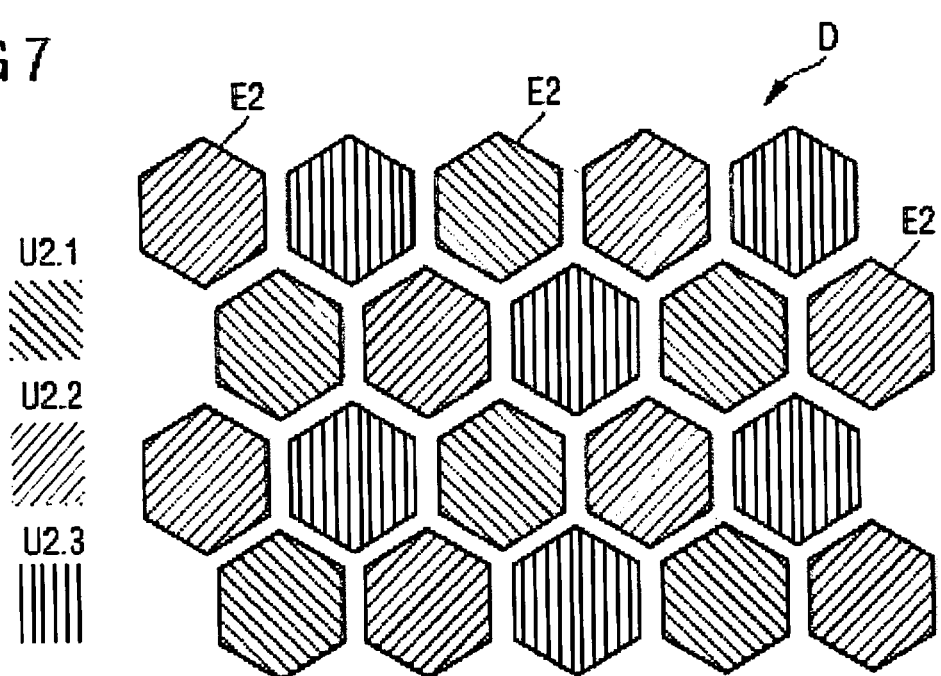
FIG. 7 shows a view onto the subsurfaces of a semiconductor radiation detector with hexagonally formed subsurfaces having three alternating voltage potentials.

Another variant of a detector D is shown again in FIG. 7. This detector has a plurality of tightly packed electrode subsurfaces E2 embodied in a hexagonal manner, wherein it is sufficient with this embodiment to use three different voltage potentials $U2.1$ to $U2.3$ in order to rule out the interference of adjacent electrode subsurfaces with the same potential and thus field-line free volumes V.

With all the embodiment variants shown here, $U2.1<U2.2<U2.3<U2.4<<U1$ or $U2.1>U2.2>U2.3>U2.4>>U1$ applies with respect to the voltage potentials used.

Figure 8:
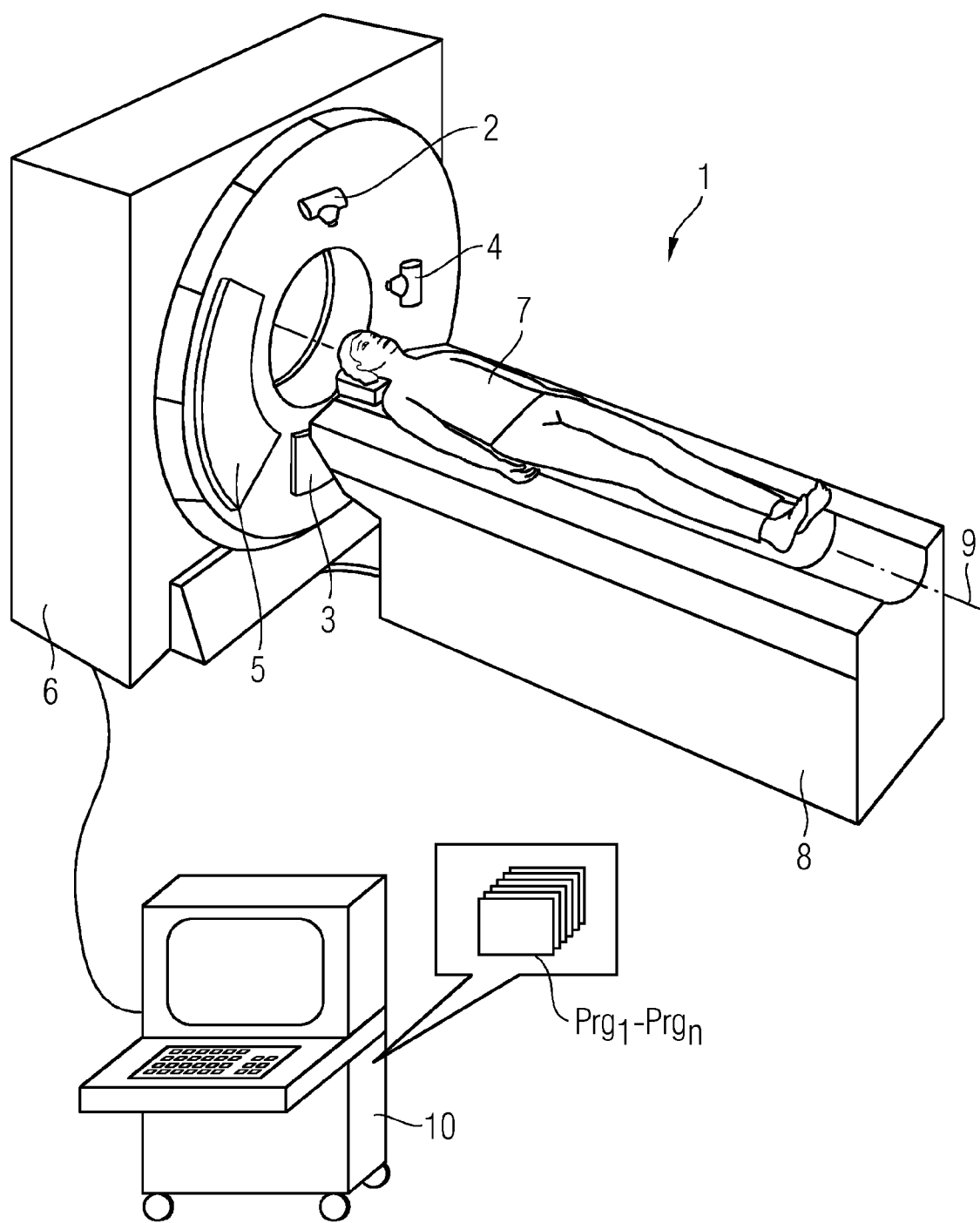
FIG. 8 shows a CT system with an embodiment of an inventive detector.

The afore-described embodiment of the inventive detector can be used in a medical diagnostic system, in particular a CT, C-arm system, PET or SPECT. An example CT system 1 is shown schematically by way of example in FIG. 8. Such a CT system generally has a gantry housing 6, in which a gantry (not shown in more detail here) is located, to which at least one x-ray emitter 2 with an opposing detector 3 is fastened. During the scanning process and in order to generate projection data, the rotating part of the gantry rotates with the emitter 2 and the detector 3, while a patient 7, with the aid of a movable patient couch 8, is moved continuously or sequentially along the system axis 9 through the measuring field in the gantry housing 6. A further emitter-detector system 4 and 5 can optionally also be arranged at a different angle on the gantry, which then allows further projections to be acquired at the same time. In accordance with the invention, at least one of the detectors is embodied such that adjacent electrode subsurfaces are held at least partially on different voltage potentials or are connected to different voltage potentials.

This CT system 1 is controlled by the control and computing unit 10, which has a memory for corresponding computer programs Prg1-Prgn. An embodiment of the inventive calibration of the individual detector elements can also be executed with such a computer, wherein corresponding program codes are stored in the memory of the computer, which execute the method according to an embodiment of the invention during operation.

Overall, an embodiment of the invention therefore proposes configuring a detector such that adjacent subsurfaces of electrodes, which form individual detector pixels, are displaced at least partly on different voltage potentials such that as few field-free volumes as possible develop in the intermediate areas between the subsurfaces.

Although the invention has been illustrated and described in detail by way of the preferred example embodiment, the invention is not limited by the disclosed examples and other variations can be derived herefrom by the person skilled in the art, without departing from the scope of protection of the invention.

What is claimed is:

1. A radiation detector, comprising:
   a plurality of detector elements arranged adjacent to one another in a planar manner, the plurality of detector elements including
   a semiconductor layer to detect radiation,
   at least a first common electrode at a first side of the semiconductor layer, the first common electrode extending across several of the plurality of detector elements,
   a plurality of individual second electrodes arranged at a second side of the semiconductor layer to generate an electrical field in response to an applied voltage between the first common electrode and the plurality of individual second electrodes, each of the plurality of individual second electrodes being assigned an effective volume to collect charge in the semiconductor layer,
   wherein the second side of the semiconductor layer is opposite the first side of the semiconductor layer,
   wherein the plurality of individual second electrodes are alternately connected to at least two different voltage potentials to develop field lines (i) between the first common electrode and the plurality of individual second electrodes, and (ii) in a boundary area between the plurality of individual second electrodes having different electrical potentials,
   wherein sub-surfaces of the semiconductor layer corresponding to the plurality of individual second electrodes have a same effective pixel size, and
   wherein the sub-surfaces are at the second side of the semiconductor layer.

2. The radiation detector of claim 1, wherein the plurality of individual second electrodes are connected in rows or columns with different voltage potentials.

3. A medical diagnostic system comprising:
   at least one radiation detector, wherein the at least one radiation detector is the radiation detector of claim 2.

4. The radiation detector of claim 1, wherein three different voltage potentials are provided for the plurality of individual second electrodes.

5. The radiation detector of claim 4, wherein the plurality of individual second electrodes are hexagon-shaped, and respectively connected to the at least two different voltage potentials such that adjacent electrode areas always have different voltage potentials.

6. A medical diagnostic system comprising:
   at least one radiation detector, wherein the at least one radiation detector is the radiation detector of claim 4.

7. The radiation detector of claim 1, wherein four different voltage potentials are provided for the plurality of individual second electrodes.

8. A medical diagnostic system comprising:
   at least one radiation detector, wherein the at least one radiation detector is the radiation detector of claim 7.

9. The radiation detector of claim 1, wherein the plurality of individual second electrodes are arranged in a checkerboard manner and are respectively connected to the at least two different voltage potentials such that adjacent electrode areas always have different voltage potentials.

10. A medical diagnostic system comprising:
    at least one radiation detector, wherein the at least one radiation detector is the radiation detector of claim 9.

11. The radiation detector of claim 1, wherein surfaces of the plurality of individual second electrodes with different voltage potentials are configured such that each of the plurality of detector elements acquires a same effective volume in the semiconductor layer irrespective of the applied voltage potential through field lines of a respective detector element.

12. The radiation detector of claim 1, further comprising a device configured to compensate for differently sized effective volumes of the plurality of detector elements.

13. The radiation detector of claim 1, wherein the radiation detector is a counting detector.

14. The radiation detector of claim 1, wherein the radiation detector is a CT detector.

15. A medical diagnostic system comprising:
at least one radiation detector, wherein the at least one radiation detector is the radiation detector of claim 1.

16. The radiation detector of claim 1, wherein the first common electrode and the plurality of individual second electrodes are planar electrodes.

17. The radiation detector of claim 16, wherein the first common electrode is in parallel with the plurality of individual second electrodes.

* * * * *